United States Patent [19]

Besson

[11] 4,257,020
[45] Mar. 17, 1981

[54] PIEZOELECTRIC RESONATOR
[75] Inventor: Raymond J. Besson, Besançon, France
[73] Assignee: Etat Francais represente par le Delegue General Pour l'Armement, Paris, France
[21] Appl. No.: 3,907
[22] Filed: Jan. 15, 1979

[30] Foreign Application Priority Data

Jan. 27, 1978 [FR] France .................................. 78 02261

[51] Int. Cl.³ .................... H03H 9/13; H03H 9/15; H01P 7/06
[52] U.S. Cl. .................................. 333/187; 310/371; 333/222; 333/227
[58] Field of Search ................................ 333/186–192, 333/222, 227; 310/348–354, 367–371, 311–321, 357–358, 365, 366; 331/154, 155, 158, 163

[56] References Cited

U.S. PATENT DOCUMENTS

| Re. 26,707 | 11/1969 | Cutler et al. ................... 310/349 X |
| 3,339,091 | 8/1967 | Hammond et al. ............... 310/349 X |
| 3,745,385 | 7/1973 | Nakajima et al. .................... 310/358 |
| 4,135,108 | 1/1979 | Besson ............................. 310/352 X |

FOREIGN PATENT DOCUMENTS

| 2325093 | 4/1977 | France . |
| 2338607 | 8/1977 | France . |
| 2353997 | 12/1977 | France . |
| 578803 | 8/1976 | Switzerland . |

Primary Examiner—Marvin L. Nussbaum
Attorney, Agent, or Firm—Lewis H. Eslinger

[57] ABSTRACT

A piezoelectric resonator comprises a crystal having an outer peripheral portion connected to a central portion by an intermediate zone which is short in the radial direction, is hollowed out over its major part and has at least two connector bridges between the outer and central portions. Electrodes are arranged facing one of the main portions of the crystal which then forms the vibrating portion of the resonator. The non-vibrating main portion serves as a support for the crystal. The surfaces of the connector bridges are continuous with the corresponding surfaces of the vibrating portion.

15 Claims, 8 Drawing Figures

PIEZOELECTRIC RESONATOR

This invention relates to a piezoelectric resonator having a self-suspended crystal, of the type comprising a crystal having a peripheral portion forming a ring connected to a central portion by an intermediate zone which has a short length in the radial direction, is hollowed out over a major part and has at least two connector bridges for making the central portion and the peripheral portion integral with one another, and two means to generate an alternating electrical excitation field arranged opposite respective faces of one of the portions, central and peripheral, which portion then forms the active vibrating portion of the resonator, the other portion not subjected to the electrical field forming a support portion for the resonator.

Piezoelectric resonators are already known in which the active portion of the crystal is suspended inside a casing by means of a portion of the base crystal which is connected to the active portion by an intermediate zone having over at least one portion of its radial length a thickness reduced with respect to the thickness of the active portion and of the portion serving as the support inside an airtight casing.

A resonator of that type is described especially in French Patent Application No. 2,338,607 of the Jan. 16th 1976 and in French Patent Application No. 77.17309 of the June 7th 1977. Self-suspension of a piezoelectric resonator crystal confers important advantages as regards facility of production and the performance of the resonator. The active portion of the crystal is, in fact, connected to the portion forming the support by an intermediate zone which is part of the base crystal and thus does not include any foreign material applied, for example, by welding or gluing.

A self-suspended crystal of the aforesaid type may be provided with electrodes arranged on its active portion or may cooperate with independent electrodes deposited on discs or plates arranged facing the crystal. Similarly, the active portion of the crystal may consist of the central portion of the crystal or of the peripheral portion, depending upon the location of the electrodes with respect to these portions.

However, known piezoelectric resonators having self-suspended crystals exhibit certain inadequacies because the intermediate zone between the active portion and the portion forming the support must be subjected to machining in order to cause thinning of this zone. This operation increases the cost of manufacture of the resonator whilst increasing its fragility and, especially, its sensitivity to acceleration.

The present invention is aimed at correcting the aforesaid disadvantages and at enabling resonators to be obtained in a simple way, having high performance and having, in addition, improved mechanical and electrical qualities.

These aims are achieved in a resonator of the above-described type in which, in accordance with the invention, at the level of the bridges in the intermediate zone each outer surface of the crystal has a continuity of tangent plane with the corresponding outer surface of at least the active portion of the crystal.

Preferably at the level of the bridges in the intermediate zone each outer surface of the crystal has a continuity of tangent plane with the corresponding outer surface of both the active portion and the support portion of the crystal.

Thus, it has become surprisingly apparent that the qualities of the resonator can be excellent even if, contrary to the teaching of the prior art, the connector bridges between the active portion and the peripheral portion of the crystal are not thinned, that is to say, if the intermediate portion of the crystal does not have, along its whole circumference, a thickness reduced with respect to the thickness of the central and peripheral portions. In accordance with the invention it is sufficient that the intermediate zone of the crystal is hollowed out for the most part, and the connector bridges are advantageously produced without forming any discontinuity with the central and peripheral portions. This leads to an improvement of the performance, on condition that the thinned bridges have a reduced width. The sensitivity of the crystal to accelerations is thus reduced because it is sufficient to produce hollows in the intermediate zone by, for example, ultrasonic machining, and grinding of the intermediate zone is no longer necessary. This leads to simplification in manufacture, whilst reducing the fragility of the resonator.

The invention is naturally applicable to crystals of various forms: biplano, biconvex, plano-convex.

Preferably, the width of each bridge represents a fraction of the intermediate zone which lies between about three thousandths and one hundredth of the length of the mean contour of the intermediate zone, but within the invention the width of each bridge can represent a fraction of the intermediate zone which is less than or equal to about four hundredths of the length of the mean contour of the intermediate zone.

The quality of the resonator is particularly good if the bridges in the intermediate zone are arranged along directions which correspond with an absolute or relative minimum of Young's modulus for the crystal, or if the bridges in the intermediate zone are arranged along directions which correspond with an absolute or relative maximum of Young's modulus for the crystal.

In accordance with a particular embodiment, the crystal comprises in its intermediate zone three connector bridges arranged at 120° to one another, one of the connector bridges being arranged along the ZZ' axis of the crystal.

Because the intermediate zone has not been thinned over its whole surface, and because it only has hollows separated by bridges which are not thinned, it is easy to produce contours of the intermediate zone which are not circular, which leads to an advantageous structure to the extent that the symmetries of the crystal can be respected. In this case, the active vibrating portion of the crystal has, next to the intermediate zone, a non-circular contour such that the compression shear wave generated by the desired thickness shear in the crystal reaches every point on the contour of the active portion at the same time.

The structure defined within the scope of the present invention is capable of leading to numerous advantageous applications. Thus it is possible to produce resonators which operate at very high frequencies and make use of crystals which have very small thickness since the connector bridges may have the same thickness as the other portions of the crystal.

In a particular application of the invention a UHF resonator has a piezoelectric crystal and comprises a re-entrant cavity constituted by a closed portion of coaxial line, the central conductor of which is interrupted at one of its ends in order to form a small gap between the central conductor of the cavity and the end of the line which form the analogue of plates creating an electric field, and a piezoelectric crystal of small thickness which is interposed between these plates of the re-entrant cavity, the piezoelectric crystal being provided with a peripheral portion forming a ring connected to a central portion by an intermediate zone which has a short length in the radial direction, is hollowed out over a substantial part and comprises at least two connector bridges which make the central and peripheral portions integral with one another. At the level of the bridges in the intermediate zone each outer surface of the crystal has a continuity of tangent plane with the corresponding outer surface of at least that one of the central and peripheral portions of the crystal, which is located between the plates of the re-entrant cavity and forms the active vibrating portion of the crystal.

In an alternative form, in which the re-entrant cavity is provided with a hollow cylinder of quartz or silica, the central conductor is formed by metallisation of the inner surface of the hollow cylinder, and the outer conductor of the re-entrant cavity is formed by metallisation of the outer surface of the hollow cylinder.

Other characteristics and advantages of the present invention will become apparent from the description which follows of particular embodiments given solely by way of non-restrictive example, by reference to the attached drawings in which.

Figure 1:
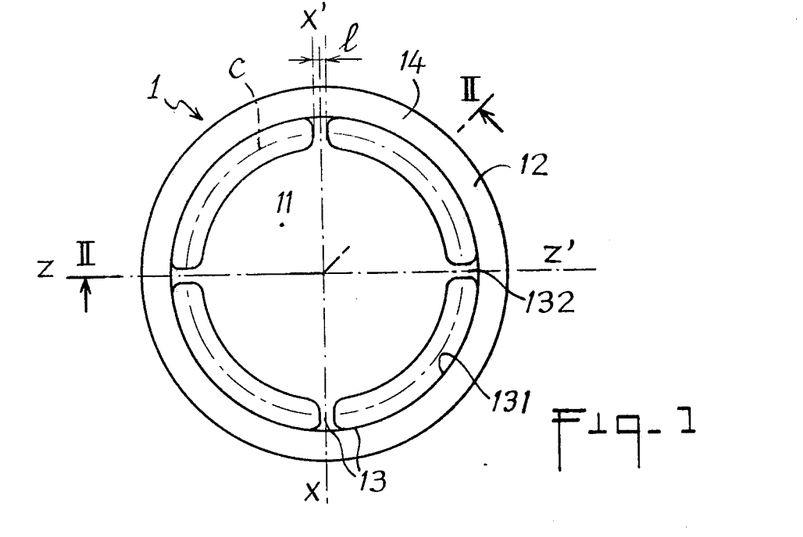
FIG. 1 is a plan seen from above of a first embodiment of a self-suspended crystal in accordance with the invention for a resonator.
Figure 2:
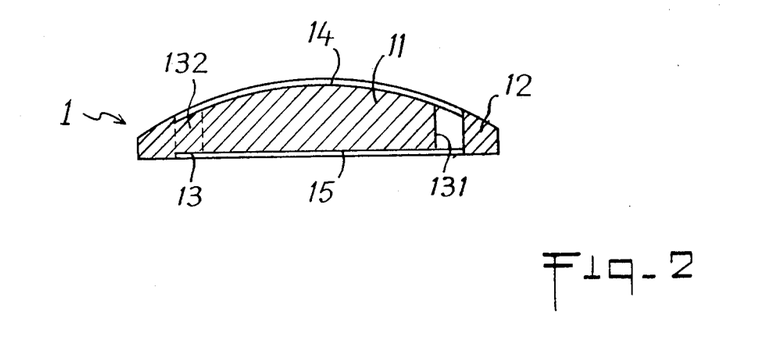
FIG. 2 is a section through the crystal taken along a line II—II of FIG. 1.

FIG. 1 represents a piezoelectric crystal 1, for example of quartz, which comprises a central portion 11 and a peripheral portion 12 separated by an intermediate zone 13. The intermediate zone 13 is formed by connector bridges 132 separated by hollows 131. The hollows 131 extend over the major part of the intermediate zone 13 and the connector bridges 132 are of small width. As may be seen in FIG. 2 there is continuity of the tangent plane for each of the outer surfaces 14 and 15 of the crystal 1 in the central zone 11 and the intermediate zone 13 at the level of the bridges 132, that is to say, the bridges 132 extend the central portion 11 without surface discontinuity. The crystal represented in FIGS. 1 and 2, which has a peripheral portion 12 of increased thickness, is suited for operation in a resonator such as, for example, that represented in FIG. 3, that is to say, a resonator in which the alternating electrical excitation field acts on the central portion of the crystal in order to make it vibrate. In the case where the piezoelectric crystal must be incorporated into a resonator in which the electrical excitation field is created at the level of the peripheral portion of the crystal, which then forms the active vibrating portion, it is naturally this latter portion which must be connected to the connector bridges without discontinuity at the level of the outer surfaces of the peripheral and intermediate portions of the crystal, whilst the central portion forming the means of support may have a thickness increased with respect, particularly, to the thickness of the connector bridges.

Figure 3:
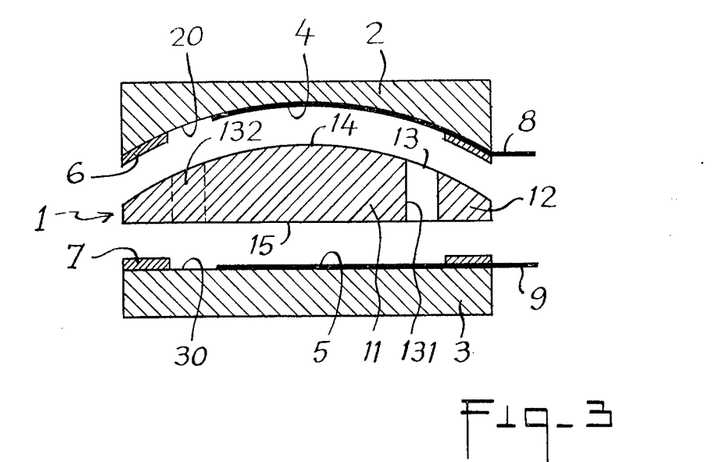
FIG. 3 is an exploded diagrammatic axial section showing the main parts of an example of a resonator in accordance with the invention.

A piezoelectric crystal of a resonator in accordance with the invention may have two outer surfaces 14 and 15 which, at the level of the connector bridges 132, do not exhibit any discontinuity. There is, in this case, a continuity of tangent plane for each of the surfaces 14 and 15 of the crystal between the central portion 11, the bridges 132 of the intermediate zone 13 and the peripheral portion 12 (FIG. 3). In this case, manufacture is particularly easy, since it is sufficient to form in the crystal hollows 131 by, for example, ultrasonic machining, without any supplementary grinding being necessary for thinning any of the central, intermediate or peripheral portions 11, 12 or 13, respectively.

In a general way, the absence of thinning at the level of the connector bridges 132 reduces the machining which is necessary, and hence reduces the cost of the resonator, whilst reducing the shear-type strains which are generated by any machining. This leads to a better insensitivity to acceleration (for example, for a quartz crystal of AT cut the sensitivity to acceleration may be less than about $5 \times 10^{-10}/g$, without reduction of the other qualities of the resonator). Besides the absence of shear-type strains, the fact of preserving at the level of the connector bridges the full thickness of the crystal increases the robustness, and in numerous cases the peak value of magnification Q, of the resonator.

When it is required to produce a supporting portion, for example the peripheral portion 12, having an increased thickness, it is sufficient, using a method which is easy to put into effect, to cover this portion 12 temporarily with wax and then to carry out a light uniform attack upon the active central portion 11 and the connector bridges 132 with, for example, a difluoride. Thus one obtains, as in the case of FIGS. 1 and 2, a general uniform reduction at the level of the central and intermediate portions of the crystal, which reduction may be very small and less than a few microns.

FIG. 3 represents a resonator having electrodes which are not adherent to the crystal, which in accordance with the invention comprises a crystal 1 which is self-suspended at unthinned bridges 132. Two electrodes 4 and 5 are arranged on two support plates 2 and 3, respectively, on the faces 20 and 30 of these plates which are facing the crystal 1. The electrodes 4 and 5, connected to feed wires 8 and 9, respectively, are arranged substantially opposite the central portion 11 of the crystal which forms, in this case, the active vibrating portion. The peripheral portion 12 of the crystal serves as a support for the latter between the two plates 2 and 3. Thin metallic layers 6 and 7 are advantageously deposited on the periphery of the inner faces 20 and 30 of the plates 2 and 3 to cooperate with the peripheral portion 12 of the crystal in order to define small gaps between the electrodes 4 and 5 and the outer surfaces of the central and intermediate portions of the crystal 1.

The self-suspended crystal structure in accordance with the present invention is naturally applicable to resonators of the type having electrodes adherent to the crystal, such as those described in French Patent Application No. 77/17309. In this case the electrodes are deposited on the outer faces of the portion of the crystal which is to vibrate, and the connection of the electrode to the connecting wires may be effected at the level of the portion of the crystal forming the support. A metallic deposit forming a conductive path between an electrode and a connection point passes over one of the bridges of the crystal, and the formation of such a deposit is facilitated since, in accordance with the present invention, the bridge is not decreased in thickness.

It is of particular interest that the width of the bridges 132 of a piezoelectric crystal of a resonator in accordance with the invention is reduced. Preferably, the average width l of each bridge 132 represents a fraction of the intermediate zone 13 of the crystal which is less than or equal to about four hundredths of the length of the mean circumference C of the intermediate zone 13, and more particularly lies between about three thousandths and one hundredth of the length of said mean circumference C of the intermediate zone 13.

By way of example, resonator crystals have been produced for 5 MHz, partial mode 5, having a central portion 11 of 15 mm diameter, a mean circumference C of 17 mm diameter, and a bridge width l lying, for each bridge, within a range of from about 0.2 mm to 2 mm.

The connector bridges 132 are advantageously located along directions which correspond with an absolute or relative extreme value of Young's modulus for the crystal.

Figure 4:
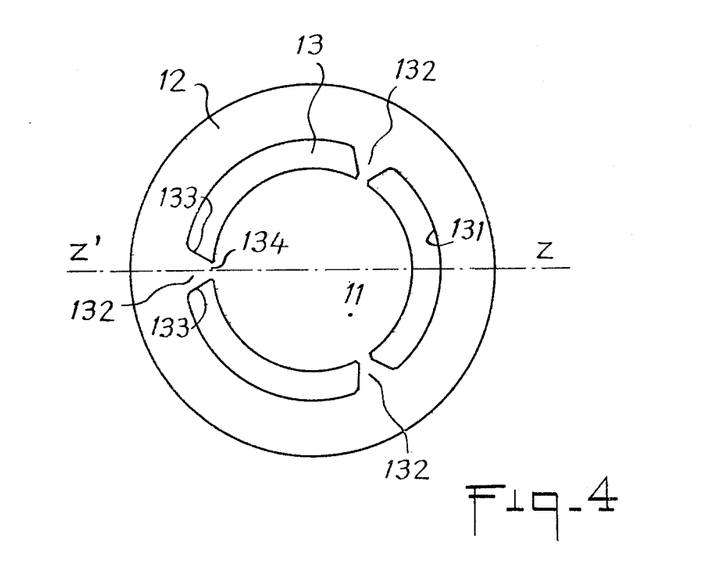
FIGS. 4 to 6 are complete or partial plans of different particular embodiments of self-suspended piezoelectric resonator crystals in accordance with the invention.
Figure 5:
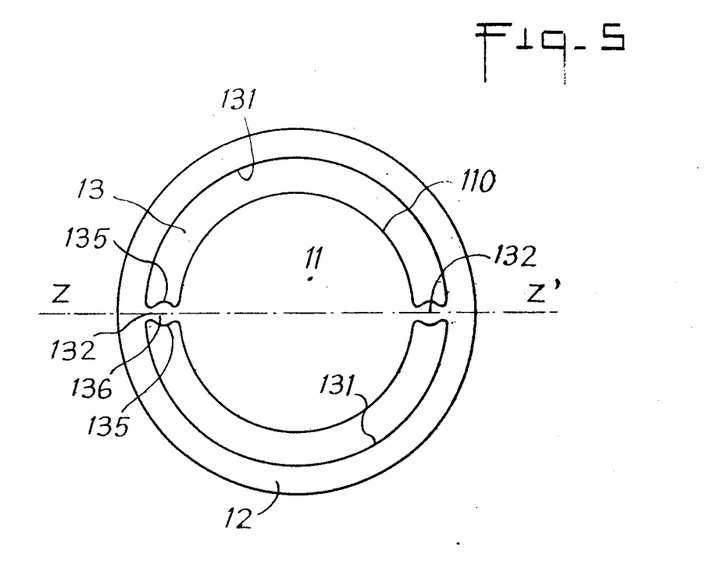

FIG. 1 shows a crystal having four bridges 132 located along the XX' and ZZ' axes of the crystal. In FIG. 4 can be seen three bridges 132 arranged at 120° to one another, one of the bridges being located along the ZZ' axis of the crystal. FIG. 5 shows a crystal suspended by only two bridges 132 located along the ZZ' axis of the crystal. The location and the number of bridges may be different depending upon the required applications.

Figure 6:
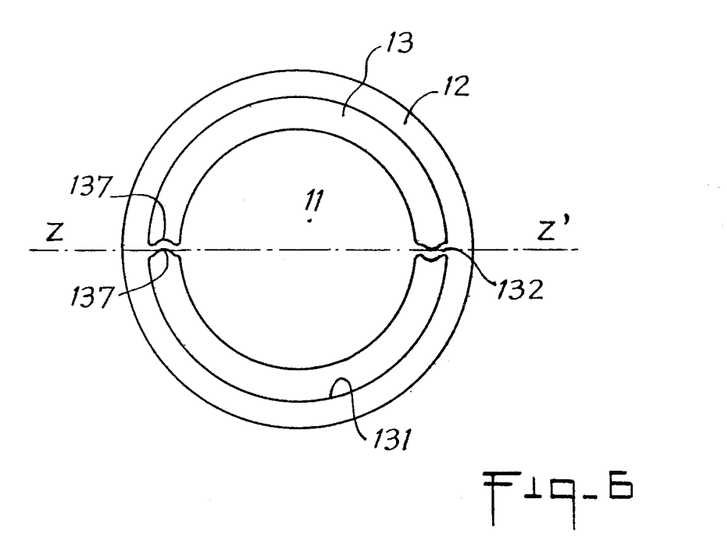

The actual form of the active vibrating portion of the crystal connected by the connector bridges to the portion forming the support may be adapted to the nature of the crystal employed. Thus, in FIG. 6 is seen a central portion 11 intended to form the active portion of the crystal, which has adjacent the intermediate zone 13 a non-circular contour 110 such that the compression shear wave generated by the required thickness shear in the crystal 1 reaches every point on the contour 110 of the active portion 11 at the same time. The non-circular contour 110 thus respects the symmetries of the crystal and as shown, for example, in FIG. 6, the contour 110 is slightly drawn out along the axis ZZ' of the crystal. Because the contour 110 is so designed that the compression shear wave generated shall reach every point on the boundary 110 of the central portion 11 at the same time, the return wave after reflection is in phase with the main wave. In the case where the active portion of the crystal 1 is the outer peripheral portion 12, it is naturally the inner contour of portion 12 which may then assume a non-circular shape. The adaptation of the shape of the contour of the active portion of the crystal leads to an improvement in the purity of the spectrum of frequencies obtained, whilst preserving the same quality coefficient.

As may be seen particularly in FIGS. 1, 4, 5 and 6, the shape of the bridges may be varied. Thus, FIG. 1 shows radial bridges having a substantially constant width. On the other hand, FIG. 4 shows connector bridges 132 which have side edges 133 which converge towards the active portion of the crystal, which consists, in accordance with the example in FIG. 4, of the central portion 11. Connector bridges as represented in FIG. 4 thus have a reduced width adjacent the portion 134 attached to the active portion of the crystal, whilst the upper and lower faces of these bridges remain on the extension of the upper and lower surfaces of the active portion of the crystal. FIG. 5 shows another type of connector bridge 132 having side edges 135 which are convex so as to produce a bulge 136 in width in the central portion of the bridge. In FIG. 6 are seen connector bridges 132 the side edges 137 of which have a substantially sinusoidal profile. The various shapes which the connector bridges 132 may adopt as seen from above enable the mechanical adaptation to be modified at the level of the connections between the active and non-active portions of the crystal. These bridge shapes do not modify the characteristic according to which the thickness of the bridges is in continuity with the thickness of at least the active portion of the crystal. Furthermore, it is well to observe that the shape of the bridges represented in the figures is not necessarily connected with the shape of the central portion 11 or the peripheral portion 12, or with the number of bridges.

A piezoelectric crystal which is self-suspended on non-thinned bridges, such as described with reference to the various figures, is particularly suited to incorporation into a very high frequency resonator.

It is known that resonators for operation at very high frequencies are particularly tricky to produce. In particular, resonators of conventional type having adherent electrodes may operate at up to about 300 MHz with a peak magnification coefficient Q of about 18000.

However, because such resonators have adherent electrodes, the effect of the metallic deposit assumes an important part of the overall thickness of the crystal, which is very small (of the order of 5 to 20 microns). The damping effect due to the electrode deposit then becomes prohibitive. An improvement may be obtained with the conventional type of resonator to the extent that a resonator is employed of the type having non-adherent electrodes. However, the impedance corresponding to the static capacitance of the resonator becomes very low for very high frequencies, so that conventional resonators of the type having electrodes, which may or may not be adherent, remain limited to frequencies less than about 500 MHz as a result of the difficulties which arise in maintaining a potential difference at the terminals of the resonator electrodes.

Resonators for very high frequencies, higher than about 500 MHz, therefore no longer make use of two electrodes at different potentials creating a real electrical field, but employ the properties of circuits having distributed constants and necessitate the use of a re-entrant cavity in which the spaced plates creating the electrical field are at the same potential. The use of re-entrant cavities for very high frequency resonators has been described, in particular, in an article by Ellen S. Stewart and James L. Stewart published in "The Journal of the Acoustical Society of America", vol. 35, no. 7 of July 1963, pages 975 to 981. As a re-entrant cavity is a circuit having distributed constants, the maintenance of an electrical field between the plates of the cavity, between which plates is located a quartz crystal, is possible even with crystal of small thickness. However, it has been shown that the use of fine blades of quartz in the form of plates or discs without hollows leads to poor results because of the losses in acoustic energy in the vicinity of the edges of the blade. Furthermore, the use of piezoelectric crystals of the self-suspended type which have a central portion and a peripheral portion separated by a thinned intermediate zone cannot be envisaged because, taking into account the small thickness of the crystals employed at very high frequencies, the mechanical strength would become too low.

The present invention enables VHF resonators of very good quality to be produced due to the use of piezoelectric crystals of the type comprising a peripheral portion 12 which forms a ring connected to a central portion 11 by an intermediate zone 13 which has a short length in the radial direction, is hollowed out over its major part and comprises at least two connector bridges 132 at the level of which each outer surface of the crystal has a continuity of tangent plane with the corresponding outer surface of at least the portion of the crystal which forms the active vibrating portion and which is located between the plates which define the electrical excitation field. In that way it is possible to produce VHF resonators which exhibit both great robustness and a high coefficient of quality. In short, the active vibrating portion is isolated from the portion forming the support by the intermediate zone 13 comprising connector bridges 132, so that the losses of acoustic energy in the vicinity of the edges of the active portion of the crystal are reduced without the fragility of the device being increased.

Figure 7:
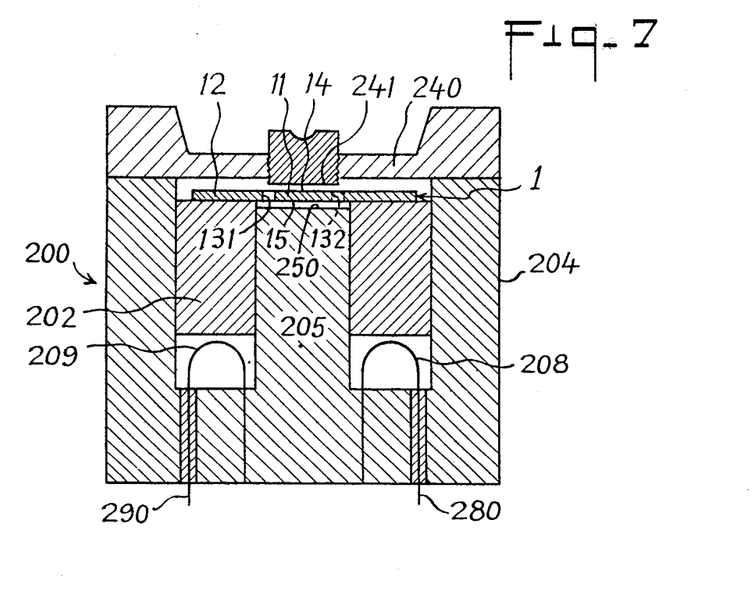
FIGS. 7 and 8 are axial sections of examples of UHF resonators in accordance with the present invention.
Figure 8:
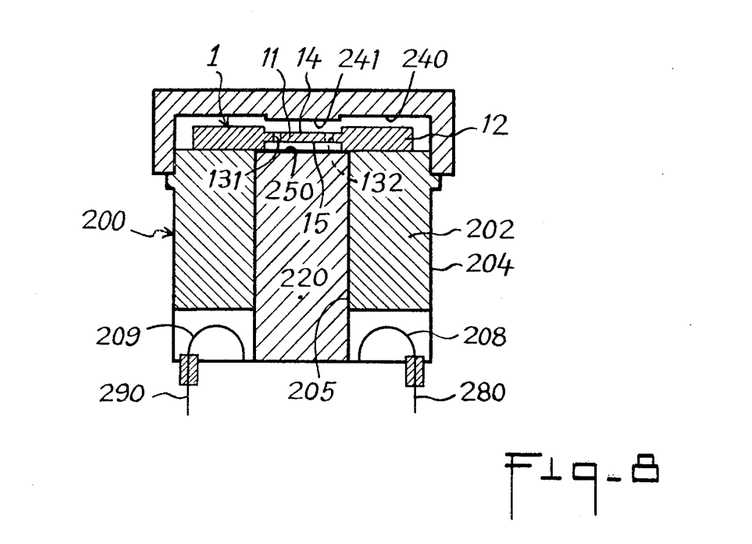

Particular embodiments of VHF resonators in accordance with the invention are represented in FIGS. 7 and 8.

FIG. 7 shows a VHF resonator comprising a re-entrant cavity 200 consisting of a closed portion of coaxial line with an outer conductor 204 and a central conductor 205. The latter is interrupted at one of its ends in order to form a plate 250. The top portion of the cavity which forms one end of the coaxial line forms a second plate 240 which is connected electrically to the outer conductor 204. In the free space located between the plates 240 and 250 is interposed a piezoelectric crystal 1, preferably plano-plane, of the self-suspended type having non-thinned bridges 132 and which exhibits one or more of the characteristics described with reference to FIGS. 1 to 6.

In a portion 202 of the re-entrant cavity located between the central conductor 205 and the outer conductor 204, the electrical field is radial, whilst in the free space lying between the lower plate 250 and the end of the line 240 forming the cover of the re-entrant cavity the electrical field is normal to the plates. The quartz crystal 1 is thus located in the electrical field normal to the plate 250. The portion 202 between the outer conductor 204 and the inner conductor 205 is advantageously filled by a block of quartz or silica, which enables the dimensions of the cavity 200 to be reduced compared with a cavity which comprises a space 202 filled with air. The quartz crystal 1 rests at its periphery 12 on the dielectric block 202, but might equally well rest on shoulders produced in the outer conductor 204. A gap is arranged between the lower plate 250 and the lower face of the central and intermediate portions 11 and 13 of the crystal 1. This gap may be formed either because the plate 250 or the end of the central conductor 205 is slightly recessed with respect to the surface supporting the peripheral portion 12 of the crystal (FIG. 7), or because the lower surface 15 of the central and intermediate portions 11 and 13 of the crystal 1 is itself slightly recessed with respect to the lower surface of the peripheral portion 12 of the crystal (FIG. 8). The position of the cover 240 of the cavity 200 is likewise adjustable, at least in its central portion 241, with respect to the outer conductor 204 so as to regulate the gap between the upper face 14 of the crystal and the cover or upper plate 240, and thereby to adjust the frequency of the cavity. The position of the crystal 1 may be made permanent by, for example, gluing or thermocompression of the lower face of the non-vibrating portion 12 of the crystal on to the lower support consisting of the block 202 or a portion of the conductor 204.

The central portion 11 and the bridges 132 of the intermediate zone 13 may have a very much reduced thickness, for example in the range between about 5 and 30 microns. The peripheral portion may, in compensation, have over at least a portion of its length a greater thickness (FIG. 8), in particular so as to be more manageable. The vibrating portion 11 of the crystal, bounded by the hollows 131 in the intermediate zone 13, and attached to the support portion 12 by the connector bridges 132 which are of small width but of unreduced thickness, is perfectly demarcated inside the gap between the armatures 204 and 205.

As appears in FIGS. 7 and 8, the re-entrant cavity 200 is provided with two coupling loops 208 and 209 each having one end connected to the body of the cavity and the other end 280 and 290, respectively, connected by way of an insulated duct to an excitation generator operating in the frequency band of the cavity, and the frequency of which is modulated. Each loop 208 and 209 penetrates into a recess arranged radially in the base of the block 202.

The re-entrant cavity excited by the coupling loops 280 and 290 exhibits a resonance curve for a field of frequencies which is adjustable by action upon the cover 240 or upon a movable portion 241 of it. The presence of the piezoelectric crystal 1 in the gap between the plates 240 and 250 causes a "crevasse" in the resonance curve of the cavity when a resonance frequency of a partial mode of the crystal is located in the pass band in the cavity. The "crevasse" or dip corresponds with the absorption of electrical energy by the crystal necessary for the excitation of the partial in question. By exploitation of such an absorption dip it is possible to produce very accurate oscillators of very high frequency.

The quality coefficient of a piezoelectric resonator of very high frequency depends very much upon the temperature. Thus, at ordinary temperature and at frequencies higher than GHz, the increase in attenuation coefficient $\alpha$ of the quartz becomes, in general, prohibitive. For this reason a resonator of the type described by reference to FIGS. 7 and 8 must be able to operate at a very low temperature in order to allow compensation for the increase in the attenuation coefficient of the quartz.

The resonator embodiment shown in FIG. 8 is particularly suited to working at low temperatures. In fact, the re-entrant cavity 200 is not formed basically of a metal such as brass, but comprises as the basic component an annular piece of quartz 202. The piece of quartz 202 is entirely metallised on its inner and outer faces as well as on its bottom face in order to form an outer conductor 204 and a central conductor 205. Into the space inside the piece 202 is introduced a block 220 which consists of a cylinder of quartz which is entirely metallised over allof its faces and which fits exactly into the central orifice in the piece 202. Thus, the metallised top flat 250 of the block 220 forms the bottom plate of the free space containing the crystal 1. The cover 240 of the cavity is likewise formed by a piece of quartz which is entirely metallised. The cover 240 preferably has a projecting portion 241 on its inner face in the zone facing the active portion 11 of the crystal 1. Adjustment of the cover 240 by grinding enables the frequency of the cavity to be regulated. The formation of a VHF resonator from a re-entrant cavity 200 made entirely of quartz, as in the embodiment shown in FIG. 8, enables both the dimensions of the cavity and the thermal strains to be reduced. Employed in combination with a self-suspended crystal having non-thinned connector bridges, in accordance with the present invention, a re-entrant cavity made entirely of quartz is suitable for forming a UHF resonator of very high quality. With a resonator of the type described with reference to FIG. 8, placed under vacuum, with the required dimensions for 1 GHz, it was possible to obtain at 1 GHz peak values of magnification lying between about $50 \times 10^3$ and $100 \times 10^3$. In a resonator of this type at 1 GHz, the basic piece 202 of quartz which is metallised apart from its top face has, for example, the following dimensions: height 6.2 mm, external diameter 6.77 mm, internal diameter 2.6 mm.

Various tests carried out with a gap between the armatures 250 and 240 of the order of 100 microns led to excellent results, especially with quartz crystals of AT or SC cut, biplanar or plano-convex, having at their active and intermediate portions a thickness lying between about 5 and 30 microns.

Of course, various modifications and additions may be carried out, by those skilled in the art, to the devices which have been described above solely by way of non-restrictive examples, without departing from the scope of the invention.

I claim:

1. A UHF responator comprising:
a re-entrant cavity including a closed portion of coaxial line having a closed end and a central conductor which is interrupted at one end thereof so as to form a small gap between the one end of the central conductor and the closed end of the line, wherein an electical field is created therebetween; and
a piezoelectric crystal extending in mutually perpendiclar axial and radial directions interposed in said gap, the crystal including a central portion having a first set of opposite first and second surfaces; a peripheral portion having a second set of opposite first and second surfaces; an intermediate zone formed of a cavity separating said central and peripheral portions, said zone having a relatively small radial dimension in respect to the radial dimension of said crystal; and a plurality of connector bridges spaced apart in said zone and interconnecting said central and peripheral portions, each said connector bridge having opposite first and second surfaces which define a thickness therebetween in the axial direction, the thickness of each said connector bridge having a dimension such that the opposite first and second surfaces of each said connector bridge and of at least one of said first and second sets together form first and second uniform continuum surfaces, respectively, whereby tangents to said first surfaces of each said connector bridge and of said at least one of said first and second sets are situated in a first plane at the points of contact therebetween and tangents to said second surfaces of each said connector bridge and of said at least one of said first and second sets are situated in a second plane at the points of contact therebetween.

2. A resonator as claimed in claim 1, wherein the re-entrant cavity comprises a hollow cylinder of one of quartz and silica which forms a central conductor by metallization of the inner surface of said hollow cylinder and which forms an outer conductor of the re-entrant cavity by metallization of the outer surface of said hollow cylinder.

3. A piezoelectric resonator comprising:
a crystal extending in mutually perpendicular axial and radial directions had including a central portion having a first set of opposite first and second surfaces, a peripheral portion having a second set of opposite first and second surfaces, an intermediate zone formed of a cavity separating said central and peripheral portions and having a relatively small radial dimension in respect to the radial dimension of said crystal, and a plurality of connector bridges spaced apart in said zone for interconnecting said central and peripheral portions, each said connector bridge having opposite first and second surfaces which define a thickness therebetween in the axial direction, the thickness of each said connector bridge having a dimension such that the respective opposite first and second surfaces of each said connector bridge and of at least one of said first and second sets together form first and second uniform continuum surfaces, respectively, whereby tangents to said first surfaces of each said connector bridge and of said at least one of said first and second sets are situated in a first plane at the points of contact therebetween and tangents to said second surfaces of each said connector bridge and of said at least one of said first and second sets are situated in a second plane at the points of contact therebetween, each said connector bridge further having opposite sides interconnecting the first and second surfaces thereof, said sides extending in the radial direction and defining a width therebetween which is relatively small in respect to the mean circumference of said intermediate zone; and
means for applying an alternating current to the first and second surfaces of one of said central portion and peripheral portion for causing said one portion to vibrate, wherein said crystal is supported at the other of said central portion and peripheral portion.

4. A resonator as claimed in claim 3, wherein the first and second surfaces of the bridges and the corresponding first and second surfaces of both the peripheral portion and the central portion are continuous such that tangents to said first and second surfaces of each said connector bridge, said central portion and said peripheral portion at the respective points of contact therebetween are situated in the same plane.

5. A resonator as claimed in claim 3, wherein at least one of the surfaces of the crystal is convex.

6. A resonator as claimed in claim 3, wherein the width of each bridge is a fraction of the mean circumference of the intermediate zone within the range of three thousandths to one hundredth.

7. A resonator as claimed in claim 3, wherein at least one of said bridges is arranged along a direction which corresponds with one of an absolute and relative minimum of Young's modulus for the crystal.

8. A resonator as claimed in claim 3, wherein at least one of said bridges is arranged along a direction which corresponds with one of an absolute and relative maximum of Young's modulus for the crystal.

9. A resonator as claimed in claim 3, wherein said crystal includes a ZZ' axis and three said connector bridges arranged at 120° to one another, one of the connector bridges being arranged along the ZZ' axis of the crystal.

10. A resonator as claimed in claim 3, wherein the vibrating portion of the crystal has a non-circular periphery adjacent the intermediate zone such that a compression shear wave generated by a thickness shear mode of vibration in the crystal reaches every point on said periphery at the same time.

11. A resonator as claimed in claim 3, wherein each said connector bridge has side edges which converge towards the vibrating portion of the crystal.

12. A resonator as claimed in claim 3, wherein each said connector bridge has side edges having a substantially sinusoidal profile.

13. A resonator as claimed in claim 3, wherein each said connector bridge has convex side edges so as to produce a bulge in the bridge at a central portion thereof.

14. A resonator as claimed in claim 3, wherein each said connector bridge has a width in the radial direction which is not greater than four hundredths of the mean circumference of said intermediate zone.

15. In a piezoelectric resonator of the type having a crystal and electrode means for supplying an alternating current to a portion of said crystal, said crystal comprising:
a central portion having a first set of opposite first and second surfaces;
a peripheral portion having a second set of opposite first and second surfaces; and
a plurality of connector bridges for connecting said central portion to said peripheral portion, each said connector bridge having opposite first and second surfaces which form first and second uniform continuum surfaces, respectively, with respective first and second surfaces of at least one of said first and second sets such that tangents to said first surfaces of each said connector bridge and of said at least one of said first and second sets are situated in a first plane at the points of contact therebetween and tangents to said second surfaces of each said connector bridge and of said at least one of said first and second sets are situated in a second plane at the points of contact therebetween, each said connector bridge further having opposite sides interconnecting the first and second surfaces thereof, said sides extending in the radial direction and defining a width therebetween which is relatively small in respect to the mean circumference of said intermediate zone.

* * * * *